United States Patent [19]

Tsuji et al.

[11] Patent Number: 5,800,965
[45] Date of Patent: Sep. 1, 1998

[54] PHOTOPOLYMERIZABLE COMPOSITION FOR A PHOTOSENSITIVE LITHOGRAPHIC PRINTING PLATE AND PHOTOSENSITIVE LITHOGRAPHIC PRINTING PLATE EMPLOYING IT

[75] Inventors: Shigeo Tsuji; Hideaki Okamoto, both of Yokohama, Japan

[73] Assignee: Mitsubishi Chemical Corporation, Tokyo, Japan

[21] Appl. No.: 772,569

[22] Filed: Dec. 26, 1996

[30] Foreign Application Priority Data

Feb. 29, 1996 [JP] Japan ................................. 8-043259
Apr. 24, 1996 [JP] Japan ................................. 8-102476

[51] Int. Cl.⁶ ........................................... G03F 7/038
[52] U.S. Cl. ........................... 430/287.1; 430/285.1; 430/284.1; 430/920; 430/916; 430/947; 522/95; 522/115; 522/123; 522/102; 522/63; 522/66
[58] Field of Search ................ 430/285, 1, 287.1, 430/284.1, 920, 916, 947; 522/95, 115, 123, 102, 63, 66

[56] References Cited

U.S. PATENT DOCUMENTS

| | | | |
|---|---|---|---|
| 5,002,977 | 3/1991 | Seko et al. | 522/149 |
| 5,153,102 | 10/1992 | Lee et al. | 430/287.1 |
| 5,262,278 | 11/1993 | Lauke et al. | 430/287.1 |
| 5,677,385 | 10/1997 | Miyake et al. | 525/286 |

FOREIGN PATENT DOCUMENTS

| | | |
|---|---|---|
| 0 496 203 A2 | 7/1992 | European Pat. Off. . |
| 0 496203 A3 | 10/1992 | European Pat. Off. . |
| 52-7364 | 3/1977 | Japan . |
| 6-148885 | 5/1994 | Japan . |
| 2 086 926 | 5/1982 | United Kingdom . |

OTHER PUBLICATIONS

Database WPI, Derwent Publications, AN 94–203089, JP 6 138 659, May 20, 1994.
Database WPI, Derwent Publications, AN 92–369438, JP 4 270 345, Sep. 25, 1992.

*Primary Examiner*—Cynthia Hamilton
*Attorney, Agent, or Firm*—Oblon, Spivak, McClelland, Maier & Neustadt, P.C.

[57] ABSTRACT

A photopolymerizable composition for a photosensitive lithographic printing plate, comprising (A) addition-polymerizable ethylenically unsaturated bond-containing monomers, (B) a photopolymerization initiator system and (C) a polymer binder having carboxyl groups in its molecule, wherein the addition-polymerizable ethylenically unsaturated bond-containing monomers (A) contain a specific monomer which is a phosphoric acid ester compound (A-1) having at least one (meth)acryloyl group and/or a compound (A-2) of the following formula

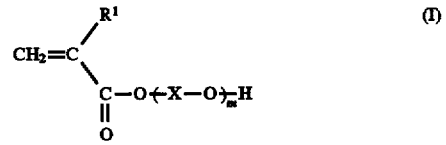
(I)

wherein $R^1$ is a hydrogen atom or a methyl group, X is a $C_{1-6}$ alkylene group which may be branched and may be substituted by halogen, and m is an integer of at least 2, and the polymer binder (C) having carboxyl groups in its molecule, is a compound having at least a part of the carboxyl groups reacted with an alicyclic epoxy group-containing unsaturated compound.

16 Claims, No Drawings

PHOTOPOLYMERIZABLE COMPOSITION FOR A PHOTOSENSITIVE LITHOGRAPHIC PRINTING PLATE AND PHOTOSENSITIVE LITHOGRAPHIC PRINTING PLATE EMPLOYING IT

The present invention relates to a photopolymerizable composition for a photosensitive lithographic printing plate and a photosensitive lithographic printing plate employing it. Particularly, it relates to a photopolymerizable composition for a photosensitive lithographic printing plate, which is highly sensitive to light rays in a visible light range and which is excellent in developability and adhesive strength to a support, and a photosensitive lithographic printing plate employing it.

In recent years, highly sensitive photosensitive materials employing photopolymerizable photosensitive materials have been studied in various fields of applications. Among them, direct plate making by laser may be mentioned as a system which is expected to be practically employed in near future. For this purpose, it is desired to develop a highly sensitive photopolymer system suitable for exposure with light having a wavelength of the laser, such as 488 nm of argon ion laser or 532 nm of YAG laser, and various proposals have been made. However, such conventional photopolymers are poor in the adhesive properties to an aluminum support and thus have a problem that the images tend to peel off during development, or printing resistance tends to be extremely low.

To improve the adhesive properties, various attempts have been made from both sides of the support and the photosensitive layer.

As a method for improving the adhesive strength of the support side, a method of anodizing an aluminum support with phosphoric acid, as disclosed, for example, in Japanese Examined Patent Publication JP-B-46-26521, may be mentioned. However, by this method, the sizes of pores in the oxidized coating film (the anodized film) on the substrate tend to be large, and the pore density tends to be high, whereby there will be problems such that the abrasion resistance of the support is low, and non-image portions tend to be abraded during printing. Further, JP-A-49-8428, JP-A-46-12903, JP-A-50-138903 and JP-A-49-93101 disclose a technique for improving the adhesive properties of the photosensitive layer by sulfuric acid anodizing followed by etching treatment by means of polyphosphoric acid or an alkali solution. However, by such a method, the anodized pore sizes are not sufficient to obtain adequate adhesive strength.

As an attempt to improve the adhesive properties from the photosensitive layer side, JP-A-50-100120 discloses that an addition-polymerizable unsaturated bond-containing phosphoric acid ester such as 2-methacryloyloxyethylhydrodiene phosphate, will adhere to a metal such as aluminum, iron or antimony. However, with such a phosphoric acid ester monomer alone, the density of the cured film tends to be relatively small, so that the film tends to be easily eroded by an aqueous alkali solution. Such is not suitable for a sensitive material which is to be subjected to aqueous development.

JP-A-1-289820 discloses an active energy ray curable resin composition containing a polymer prepared by reacting a part of carboxyl groups of a polymer binder with an alicyclic epoxy group-containing unsaturated compound. The resin of this type has a merit that the density of the cured film is relatively high, and it has an adhesive property to a support made of e.g. aluminum. However, when the composition disclosed in this publication, is used as a photopolymerizable composition for a photosensitive lithographic printing plate, both developability and printing resistance are still not adequate.

JP-A-5-25232 discloses a photopolymerizable composition prepared by a combination of a phosphoric acid ester compound of a hydroxyalkyl (meth)acrylate and a compound having a part of carboxyl groups of a polymer binder material reacted with glycidyl methacrylate. Also in this case, the printing resistance and developability for a lithographic printing plate are not yet adequate.

It is an object of the present invention to provide a photopolymerizable composition for a photosensitive lithographic printing plate which is uniformly excellent in the adhesion to an aluminum support, the sensitivity and the developability, and a photosensitive lithographic printing plate employing it, which is excellent in various printing properties.

The present inventors have conducted extensive studies to solve the above problems of the prior art and as a result, have found it possible to substantially improve removal of non-image portions and adhesion to an aluminum support, particularly to an aluminum support having a sulfuric acid-oxidized coating film, by a combined use of a phosphoric acid ester compound having at least one (meth)acryloyl group and/or a compound of the following formula (I), and a polymer binder having a part of carboxyl groups reacted with an alicyclic epoxy group-containing unsaturated compound. The present invention has been made based on this discovery.

That is, the present invention provides a photopolymerizable composition for a photosensitive lithographic printing plate, comprising (A) addition-polymerizable ethylenically unsaturated bond-containing monomers, (B) a photopolymerization initiator system and (C) a polymer binder having carboxyl groups in its molecule, wherein the addition-polymerizable ethylenically unsaturated bond-containing monomers (A) contain a specific monomer which is a phosphoric acid ester compound (A-1) having at least one (meth)acryloyl group and/or a compound (A-2) of the following formula (I):

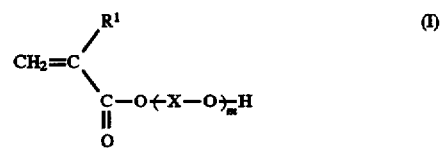

wherein $R^1$ is a hydrogen atom or a methyl group, X is a $C_{1-6}$ alkylene group which may be branched and may be substituted by halogen, and m is an integer of at least 2, and the polymer binder (C) having carboxyl groups in its molecule, is a compound having at least a part of the carboxyl groups reacted with an alicyclic epoxy group-containing unsaturated compound.

The present invention also provides a photosensitive lithographic printing plate comprising an aluminum substrate and a photosensitive resin layer, wherein the photosensitive resin layer is made of the above photopolymerizable composition for a photosensitive lithographic printing plate.

Now, the present invention will be described in detail with reference to the preferred embodiments.

The addition polymerizable ethylenically unsaturated bond-containing monomers (A) (hereinafter referred to simply as "ethylenic monomers") contained as the first essential component in the photoplymerizable composition of the present invention, are monomers having ethylenically unsaturated bonds which undergo addition polymerization and curing by an action of the photopolymerization initiator system as the second essential component, when the photopolymerizable composition is subjected to irradiation of active light rays. In the present invention, the term "monomers" is used in the concept against so-called "high molecular compounds" and accordingly includes dimers, trimers and oligomers in addition to monomers in a narrow sense.

The ethylenic monomers to be used in the present invention, are characterized in that they contain a phosphoric acid ester compound (A-1) having at least one (meth)acryloyl group and/or a compound (A-2) of the following formula (I):

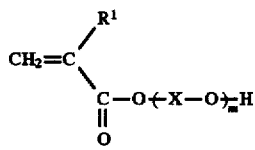

wherein $R^1$ is a hydrogen atom or a methyl group, X is a $C_{1-6}$ alkylene group which may be branched and may be substituted by halogen, and m is an integer of at least 2.

In this specification, the above compounds (A-1) and/or (A-2) will be referred to hereinafter as a specific monomer.

Among specific monomers to be used in the present invention, the phosphoric acid ester compound (A-1) having at least one (meth)acryloyl group, is not particularly limited so long as it is an ester compound of phosphoric acid with a (meth)acryloyl group-containing compound. Specifically, however, it may, for example, be a compound of the following formula (II):

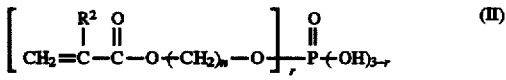

wherein $R^2$ is a hydrogen atom or a methyl group, n is an integer of from 1 to 25, and r is 1 or 2.

Among compounds of the formula (II), preferred is the one wherein n is from 1 to 10, and particularly preferred is the one wherein n is from 1 to 4. Specific examples of the particularly preferred compound include methacryloxyethyl phosphate and bis(methacryloxyethyl) phosphate.

With respect to the compound (A-2) of the formula (I) as another specific monomer to be used in the present invention, preferred is the one wherein X is a $C_{2-4}$ alkylene group which may be branched, and when the alkylene group is substituted by halogen, the substituent is preferably a chlorine atom.

Among the compounds (A-2), particularly preferred is a compound wherein X is an unsubstituted $C_2$ or $_3$ alkylene group which may be branched, such as polyethylene glycol mono(meth)acrylate or polypropylene glycol mono(meth) acrylate. Further, m in the formula (I) may be any number so long as it is an integer of at least 2. However, m is preferably from 5 to 50, as the adhesion to a support, the sensitivity and the developability are thereby most balanced.

In the present invention, the content of the specific monomer is not particularly limited, but is usually from 1 to 60 wt %, preferably from 2 to 50 wt %, more preferably from 3 to 40 wt %, in all ethylenic monomers. If the content is less than 1 wt %, the adhesion to a support and the developability tend to be poor, and if it exceeds 60 wt %, the sensitivity tends to be poor. Within the above ranges, not only the sensitivity and printing resistance, but also the developability will be improved. Further, the compound of the formula (I) and the phosphoric acid ester compound having at least one (meth)acryloyl group, may, respectively, be a single compound or a mixture of a plurality of compounds.

The composition of the present invention may contain a compound having one ethylenically unsaturated bond other than the specific monomer, as an ethylenic monomer. Specifically, such a compound may, for example, be (meth) acrylic acid, an alkyl ester of (meth)acrylic acid, acrylonitrile, styrene, or a monoester of a carboxylic acid having one ethylenically unsaturated bond with a polyhydric (or monohydric) alcohol.

In the present invention, it is preferred to use together with the specific monomer, a polyfunctional ethylenic monomer having at least two ethylenically unsaturated bonds in one molecule.

Examples of such a polyfunctional ethylenic compound include an ester of an unsaturated carboxylic acid with an aliphatic polyhydroxy compound; an ester of an unsaturated carboxylic acid with an aromatic polyhydroxy compound; and an ester obtained by an esterification reaction of an unsaturated carboxylic acid and a polybasic carboxylic acid with a polyvalent hydroxy compound such as an aliphatic polyhydroxy compound or an aromatic polyhydroxy compound.

The ester of an unsaturated carboxylic acid with an aliphatic polyhydroxy compound is not particularly limited and may, for example, be an acrylic acid ester of an aliphatic polyhydroxy compound, such as ethylene glycol diacrylate, triethylene glycol diacrylate, trimethylol propane triacrylate, trimethylol ethane triacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate or glycerol acrylate, a methacrylic acid ester having "acrylate" of such an illustrated compound substituted by "methacrylate", an itaconic acid ester likewise substituted by "itaconate", a crotonic acid ester likewise substituted by "crotonate", or a maleic acid ester likewise substituted by "maleate".

The ester of an unsaturated carboxylic acid with an aromatic polyhydroxy compound, may, for example, be an acrylic acid ester or methacrylic acid ester of an aromatic polyhydroxy compound, such as hydroquinone diacrylate, hydroquinone dimethacrylate, resorcinol diacrylate, resorcinol dimethacrylate or pyrogallol triacrylate.

The ester obtained by an esterification reaction of an unsaturated carboxylic acid and a polybasic carboxylic acid with a polyvalent hydroxy compound, may not necessarily be a single substance. Typical examples include a condensation product of acrylic acid, phthalic acid and ethylene glycol, a condensation product of acrylic acid, maleic acid and diethylene glycol, a condensation product of methacrylic acid, terephthalic acid and pentaerythritol, and a condensation product of acrylic acid, adipic acid, butanediol and glycerol.

The polyfunctional ethylenic monomer to be used in the present invention may, for example, be a urethane (meth) acrylate obtained by a reaction of a polyisocyanate compound with a hydroxyl group-containing (meth)acrylic acid ester, or a reaction of a polyisocyanate compound with a polyol and a hydroxyl group-containing (meth)acrylic acid ester; an epoxy acrylate such as an addition reaction product of a diepoxy compound with a hydroxyethyl acrylate; an acrylamide such as ethylenebisacrylamide; an allyl ester such as diallyl phthalate; or a vinyl group-containing compound such as divinyl phthalate.

Among such polyfunctional ethylenic monomers, preferred is a urethane (meth)acrylic acid ester compound obtained by reacting a polyisocyanate compound with a hydroxyl group-containing (meth)acrylic acid ester, an ester of an unsaturated carboxylic acid with an aliphatic polyhydroxy compound, or a (meth)acrylic acid ester obtained by modification from bisphenol A. Particularly preferred is a (meth)acrylic acid ester of an aliphatic polyhydroxy compound, or a (meth)acrylic acid ester of the following formula (III) which is an alkylene oxide adduct of bisphenol A:

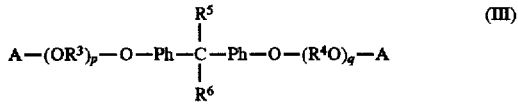

wherein A is an acryloyl group or a methacryloyl group, each of $R^3$ and $R^4$ is an alkylene group which may be branched, each of $R^5$ and $R^6$ is a hydrogen atom, an alkyl group which may have a substituent, a cycloalkyl group which may have a substituent, or a phenyl group which may have a substituent, Ph is a phenylene group, and p and q are positive integers satisfying p+q=2 to 30.

Among the compounds of the above formula (III), more preferred are compounds wherein each of $R^5$ and $R^6$ is a methyl group, and p+q=2 to 4. Specifically, 2,2-bis[4-(acryloxydiethoxy)phenyl]propane (A-BPE-4, tradename, manufactured by Shin Nakamura Kagaku Kogyo K.K.), 2,2-bis[4-(methacryloxyethoxy)phenyl]propane (BPE-100, tradename, manufactured by Shin Nakamura Kagaku Kogyo K.K.) and 2,2-bis[4-(methacryloxydiethoxy)phenyl]propane (BPE-200, tradename, manufactured by Shin Nakamura Kagaku Kogyo K.K.) may, for example, be mentioned.

As the polyisocyanate compound to be used for the synthesis of the above urethane (meth)acrylic acid ester compound, various polyisocyanate compounds known as materials for polyurethane, may be used, such as aromatic diisocyanates, alicyclic diisocyanates, aliphatic diisocyanate compounds and their derivatives such as trimers. More preferably, diphenylmethane diisocyanate, tolylene diisocyanate, xylylene diisocyanate, hexamethylene diisocyanate, trimethyl hexamethylene diisocyanate, isophorone diisocyanate, cyclohexane diisocyanate and isocyanulate compounds may, for example, be mentioned.

As the hydroxyl group-containing (meth)acrylic acid ester to be reacted with the polyisocyanate compound, preferred is a compound having a plurality of acryloyl groups or methacryloyl groups and one hydroxy group. Specifically, a reaction product of glycidyl (meth)acrylate with (meth)acrylic acid or pentaerythritol tri(meth)acrylate may, for example, be mentioned.

Now, the photopolymerization initiator system (B) as the second essential component of the photopolymerizable composition of the present invention, will be described.

As such a photopolymerization initiator system, any initiator system may be employed so long as it is capable of initiating polymerization of the above ethylenic monomers. Especially, the one having an activity against light rays in a visible light range is preferred. As an active agent which forms active radicals by some interaction with a sensitizer excited by light, a titanocene, a hexaarylbiimidazole, a halogenated hydrocarbon derivative, a diaryliodonium salt, or an organic peroxide may, for example, be mentioned. Among them, a composition employing a titanocene or a hexaarylbiimidazole, is preferred, since the sensitivity, storage stability, adhesion of the coating film to the substrate, etc. are good.

As the titanocene, various types having a titanocene structure may be employed. For example, it may be suitably selected for use among various titanocene compounds disclosed in e.g. JP-A-59-152396 and JP-A-61-151197. More specifically, it may, for example, be dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-2,6-diflourophen-1-yl, dicyclopentadienyl-Ti-bis-2,4-difluorphen-1-yl, dimethylcyclopentadienyl-Ti-bis-2,3,4,5,6-pentafluorophen-1-yl, dimethylcyclopentadienyl-Ti-bis-2,6-difluorophen-1-yl, or dicyclocyclopentadienyl-Ti-bis-2,6-difluoro-3-(pyr-1-yl)-phen-1-yl.

As the hexaarylbiimidazole, various types having a hexaarylbiimidazole structure may be employed. Preferred are hexaarylbiimidazoles having halogen substituents on benzene rings, such as 2,2'-bis(o-chlorophenyl)-4,4', 5,5'-tetra(p-fluorophenyl)biimidazole, 2,2'-bis(o-bromophenyl)-4,4', 5,5'-tetra(p-iodophenyl)biimidazole, 2,2'-bis(o-chlorophenyl)-4,4', 5,5'-tetra(p-chloronaphthyl)biimidazole, 2,2'-bis(o-chlorophenyl)-4,4', 5,5'-tetra(p-chlorophenyl)biimidazole, 2,2'-bis(o-bromophenyl)-4,4', 5,5'-tetra(p-chloro-p-methoxyphenyl)biimidazole, 2,2'-bis(o-chlorophenyl)-4,4', 5,5'-tetra(o,p-dichlorophenyl)biimidazole, 2,2'-bis(o-chlorophenyl)-4,4', 5,5'-tetra(o,p-dibromophenyl)biimidazole, 2,2'-bis(o-bromophenyl)-4,4', 5,5'-tetra(o,p-dichlorophenyl)biimidazole, and 2,2'-bis(o,p-dichlorophenyl)-4,4', 5,5'-tetra(o,p-dichlorophenyl) biimidazole.

These hexaarylbiimidazoles may be used in combination with other biimidazoles, as the case requires. Biimidazoles can be easily prepared, for example, by the methods disclosed in Bull. Chem. Soc. Japan, 33, 565 (1960) and J. Org. Chem, 36[16]2262 (1971).

Now, the sensitizer within the photopolymerization initiator system will be described. The sensitizer in the present invention is preferably a compound which is capable of effectively generating active radicals under irradiation with visible light rays when it is coexistent with the above described active agent.

Typical examples of such a sensitizer include a triphenylmethane-type leuco dye such as leuco crystal violet or leuco malachite green, and a photo-reducible dye such as erythrocin or Eosine Y, as disclosed in e.g. U.S. Pat. No. 3,479,185, an aminophenylketone such as Michler's ketone or aminostyrylketone as disclosed in e.g. U.S. Pat. Nos. 3,549,367 and 3,652,275, β-diketones as disclosed in U.S. Pat. No. 3,844,790, indanones as disclosed in U.S. Pat. No. 4,162,162, ketocumarins as disclosed in JP-A-52-112681, aminostyrene derivatives and aminophenylbutadiene derivatives as disclosed in JP-A-59-56403, aminophenyl heterocyclic compounds as disclosed in U.S. Pat. No. 4,594,310, julolidine heterocyclic compounds as disclosed in U.S. Pat. No. 4,966,830, and pyromethene type dyes as disclosed in JP-A-5-241338.

A hydrogen donative compound such as 2-mercaptobenzothiazole, 2-mercaptobenzimidazole, 2-mercaptobenzoxazole, 3-mercapto-1,2,4-triazole, N-phenylglycine or an alkyl N,N-dialkyl benzoate, may be added to the photopolymerization initiator system of the present invention, as the case requires, to further improve the photopolymerization initiating ability. Among them, particularly preferred is a compound having a mercapto group, such as 2-mercaptobenzothiazole, 2-mercaptobenzimidazole, 2-mercaptobenzoxazole or 3-mercapto-1,2,4-triazole, or an alkyl N,N-dialkyl benzoate.

Now, the polymer binder (C) having carboxyl groups in its molecule and having at least a part of the carboxyl groups reacted with an alicyclic epoxy group-containing unsaturated compound (hereinafter referred to simply as "the ethylenic polymer binder") as the third essential component of the present invention, will be described. This ethylenic polymer binder may be prepared by reacting an inert organic solvent solution (such as an alcohol type, ester type, aromatic hydrocarbon type or aliphatic hydrocarbon type solution) of a polymer binder having carboxyl groups in its molecule, with an alicyclic epoxy group-containing unsaturated compound at a temperature of from 80° to 120° C. for from about 1 to 50 hours. The proportion of carboxyl groups to be reacted with the alicyclic epoxy group-containing unsaturated compound is not particularly limited so long as it is within a range wherein the effects of the present invention can be accomplished. However, it is preferred to react from 5 to 90 mol %, more preferably from 20 to 80 mol %, most preferably from 30 to 70 mol %, of all carboxyl groups. Within such ranges, the developability as well as the adhesion is excellent.

The polymer binder having carboxyl groups in its molecule, which is useful for the preparation of the ethylenic polymer binder, may specifically be, for example, a homopolymer or copolymer of (meth)acrylic acid, a (meth)acrylic acid ester, (meth)acrylamide, maleic acid, (meth)acrylonitrile, styrene, vinyl acetate, vinylidene chloride or maleimide, or others such as polyethylene oxide, polyvinylpyrrolidone, polyamide, polyurethane, polyester, polyether, polyethyleneterephthalate, acetylcellulose or polyvinylbutyral. Among them, a copolymer comprising at least one (meth)acrylic acid ester and (meth)acrylic acid as copolymer components, is preferred. The acid value of the polymer binder having carboxyl groups in its molecule, is preferably from 10 to 250, and the weight average molecular weight (hereinafter referred to simply as Mw) is preferably from 5,000 to 200,000.

The alicyclic epoxy group-containing unsaturated compound which is useful for the preparation of the ethylenic polymer binder to be used in the present invention, is a compound having at least one addition-polymerizable unsaturated bond and an alicyclic epoxy group in one molecule. Here, the alicyclic epoxy group is a group having a structure in which a non-aromatic ring and an oxirane skeleton are fused. Preferred is a group having a structure wherein a cycloalkane skeleton and an oxirane skeleton are fused. Preferred specific examples of the alicyclic epoxy group-containing unsaturated compound to be used in the present invention, include compounds of the following formulas (IV) to (XVII):

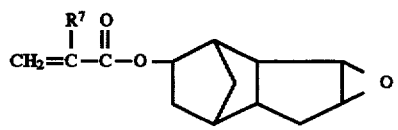

(IV)

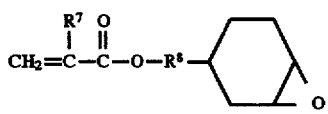

(V)

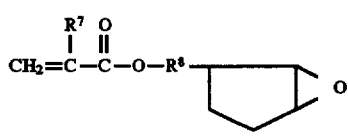

(VI)

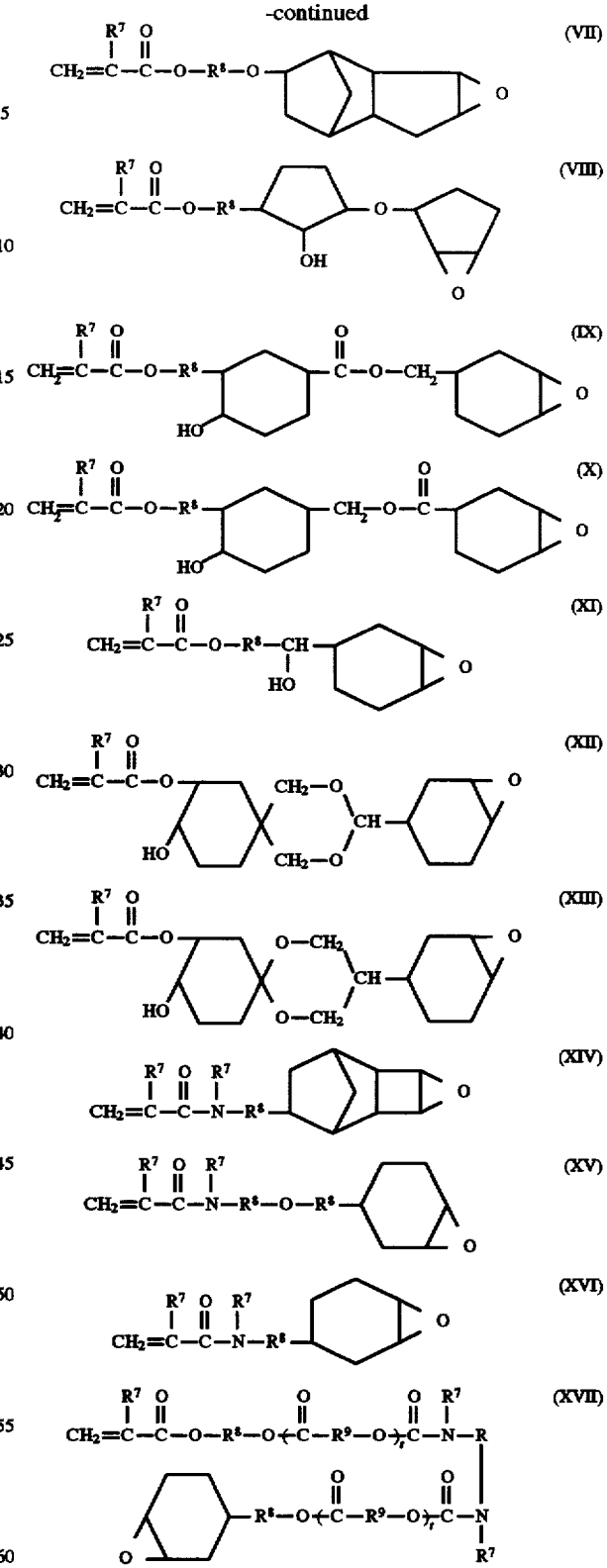

In the above formulas, $R^7$ is a hydrogen atom or a methyl group, $R^8$ is a $C_{1-6}$ bivalent aliphatic hydrocarbon group, $R^9$ is a $C_{1-10}$ bivalent hydrocarbon group, and t is an integer of from 0 to 10.

In the above general formulas for the alicyclic epoxy group-containing unsaturated compound, preferred are those wherein $R^7$ is a hydrogen atom or a methyl group, $R^8$ is a methylene group, an ethylene group, a propylene group, a tetramethylene group, an ethylethylene group, a pentamethylene group or a hexamethylene group, and $R^9$ is a methylene group, an ethylene group, a propylene group, a tetramethylene group, an ethylethylene group, a pentamethylene group, a hexamethylene group or a phenylene group. Among them, particularly preferred is a compound of the formula (IV), (VI) or (VII), wherein $R^7$ is a hydrogen atom or a methyl group, and $R^8$ is a $C_{1-14}$ alkylene group. Specific examples of the particularly preferred alicyclic epoxy group-containing unsaturated compound include 3,4-epoxycyclohexylmethyl acrylate and 2,3-epoxycyclopentylmethyl acrylate.

In combination with the above ethylenic polymer binder, the following compound may be used in combination as other polymer binder. Namely, a homopolymer or copolymer of (meth)acrylic acid, a (meth)acrylic acid ester, (meth)acrylamide, maleic acid, (meth)acrylonitrile, styrene, vinyl acetate, vinylidene chloride or maleimide, or others such as polyethylene oxide, polyvinylpyrrolidone, polyamide, polyurethane, polyester, polyether, polyethyleneterephthalate, acetylcellulose or polyvinylbutyral, may, for example, be mentioned. Among them, a copolymer of a (meth)acrylic acid ester is preferred. Preferred Mw of such a copolymer is from 5,000 to 200,000.

In the foregoing, the main constituting components for the photopolymerizable composition for a photosensitive lithographic printing plate of the present invention have been described in detail. Their preferred proportions are such that relative to 100 parts by weight of the polymerizable ethylenic compounds, in the photopolymerization initiator system, the sensitizer is preferably from 0.01 to 20 parts by weight, more preferably from 0.05 to 10 parts by weight, the active agent is preferably from 0.1 to 80 parts by weight, more preferably from 0.5 to 60 parts by weight, and the polymer binder is preferably from 10 to 400 parts by weight, more preferably from 20 to 200 parts by weight. The photopolymerizable composition for the photosensitive lithographic printing plate of the present invention may contain, in addition to the above-described constituting components, other materials depending upon the particular purpose. For example, a heat polymerization preventing agent such as hydroquinone, p-methoxyphenol or 2,6-di-t-butyl-p-cresol, a coloring agent composed of an organic or inorganic dye or pigment, a plasticizer such as dioctyl phthalate, didodecyl phthalate or tricresyl phosphate, a sensitivity-improving agent such as a tertiary amine or thiol, or other additives such as a colorant precursor, may be incorporated.

Preferred amounts of the various additives are such that relative to 100 parts by weight of the ethylenic compounds, the heat polymerization preventing agent is at most 2 parts by weight, the coloring agent is at most 20 parts by weight, the plasticizer is at most 40 parts by weight, and the colorant precursor is at most 30 parts by weight.

The above-described photopolymerizable composition for a photosensitive lithographic printing plate will be diluted with a suitable solvent and then coated and dried on a support to form a photosensitive layer. To be used as a photosensitive lithographic printing plate, an aluminum plate is usually employed as the support, and particularly preferred is an aluminum support having grain treatment and then anodizing treatment applied thereto. As a grain treatment method, a conventional brush polishing method, a ball polishing method, an electrolytic etching method, a chemical etching method, a liquid horning method or a sandblasting method, or a combination of these methods may be mentioned. Preferably, a brush polishing method, a ball polishing method, an electrolytic etching method, a chemical etching method or a liquid horning method may be mentioned. Further, after the grain treatment, desmatte treatment may be applied to the aluminum plate, as the case requires, by means of an aqueous alkaline or acidic solution. The aluminum plate thus obtained is usually subjected to anodizing treatment, particularly preferably, treatment with an electrolyte containing sulfuric acid. Anodizing treatment with an electrolyte containing sulfuric acid can be carried out by a conventional method such as the method as disclosed in e.g. JP-A-58-213894. Specifically, treatment is carried out, for example, at a temperature of from 5° to 50° C., preferably from 15° to 35° C., at a current density of from 1 to 60 A/dm² for from 5 seconds to 60 minutes using sulfuric acid in a concentration of from 5 to 50 wt %, preferably from 15 to 30 wt %. Further, if necessary, treatment with hot water or with an alkali metal silicate such as sodium silicate, or hydrophilic treatment by immersion in an aqueous solution containing a hydrophilic polymer compound such as a polyvinylsulfonic acid or a resin having a cationic quaternary ammonium group, may also be applied.

As the method for coating the photosensitive composition, a well known method such as dip coating, rod coating, spin coating, spray coating or roll coating, may be employed.

Further, an oxygen-shielding layer may be formed on the above photosensitive layer to prevent the polymerization inhibition action by oxygen. Such a layer may, for example, be made of a water-soluble polymer such as polyvinyl alcohol, polyvinyl pyrrolidone, polyethylene oxide or cellulose. Among them, particularly preferred is the one containing polyvinyl alcohol having a high oxygen gas barrier property.

The light source for exposure applicable to the composition of the present invention, is not particularly limited. However, carbon arc, a high pressure mercury lamp, a xenon lamp, a metal halide lamp, a fluorescent lamp, a tungsten lamp, a halogen lamp, a helium cadmium laser, an argon ion laser, a YAG laser or a helium neon laser may, for example, be particularly suitably used.

The photopolymerizable composition of the present invention is capable of forming an image on the support, if image exposure is carried out with such a light source, followed by development by means of, for example, an aqueous solution containing a surfactant and an alkali. Such an aqueous solution may further contain an organic solvent, a buffering agent, a dye or a pigment. A suitable alkali agent may, for example, be an inorganic alkali agent such as sodium silicate, potassium silicate, sodium hydroxide, potassium hydroxide, lithium hydroxide, sodium tertiary phosphate, sodium secondary phosphate, sodium carbonate, potassium carbonate or sodium hydrogencarbonate, or an organic amine compound such as trimethylamine, diethylamine, monoisopropylamine, n-butylamine, monoethanolamine, diethanolamine or triethanolamine. These compounds may be used alone or in a proper combination. The surfactant may, for example, be a nonionic surfactant such as polyoxyethylenealkylethers, polyoxyethylenealkylallylethers, polyoxyethylenealkylesters, sorbitanalkylesters or monoglyceridealkylesters, an anionic surfactant such as alkylbenzene sulfonates, alkylnaphthalene sulfonates, alkyl sulfates, alkyl sulfonates or sulfosuccinates, or an amphoteric surfactant such as alkylbetaines or amines. Further, as the organic solvent, isopropyl alcohol, benzyl alcohol, ethyl cellosolve, butyl cellosolve, phenyl cellosolve, propylene glycol or diacetone alcohol, may, for example, be incorporated, as the case requires.

Now, the present invention will be described in further detail with reference to Examples and Comparative Examples. However, it should be understood that the present invention is by no means restricted to such specific Examples.

Preparation (1) of binder 200 parts by weight of a copolymer of methyl methacrylate/isobutyl methacrylate/isobutyl acrylate/ methacrylic acid =35/20/10/35 mol % (charged ratio) having Mw=70,000 (hereinafter referred to as "binder 1"), 75 parts by weight of an alicyclic epoxy-containing unsaturated compound of the following formula:

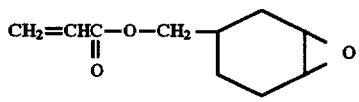

2.5 parts by weight of p-methoxyphenol, 8 parts by weight of tetrabutylammonium chloride and 800 parts by weight of propylene glycol monomethyl ether acetate, were charged into a reactor and reacted with stirring in air at 110° C. for 24 hours to obtain an ethylenic polymer binder (acid value: 60, unsaturated groups were reacted to 60% of the entire methacrylic acid component of binder 1, hereinafter referred to simply as "binder 2") solution.

Preparation (2) of binder 855 parts by weight of a copolymer of α-methylstyrene/ acrylic acid (tradename "SCX-690", manufactured by Johnson Company, acid value: 240, Mw=15,000) (hereinafter referred to simply as "binder 3"), 490 parts by weight of an alicyclic epoxy-containing unsaturated compound of the following formula:

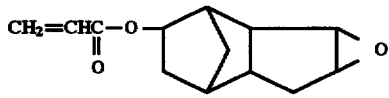

1.3 parts by weight of p-methoxyphenol, 4.3 parts by weight of tetraethylammonium chloride and 1,800 parts by weight of propylene glycol monomethyl ether acetate, were charged into a reactor and reacted with stirring in air at 120° C. for 15 hours to obtain an ethylenic polymer binder (acid value: about 170, unsaturated groups were reacted to 50% of the entire methacrylic acid component of binder 2, hereinafter referred to simply as "binder 4") solution.

Preparation (3) of binder 196 parts by weight of binder 1, 52 parts by weight of glycidyl methacrylate, 2.4 parts by weight of p-methoxyphenol, 8 parts by weight of tetraethylammonium chloride and 490 parts by weight of propylene glycol monomethyl ether acetate, were charged into a reactor and reacted with stirring in air at 120° C. for 15 hours to obtain a "binder 5" solution having an acid value of about 40 and in which glycidyl methacrylate was reacted to about 60% of the entire methacrylic acid component of binder 1.

Preparation (4) of binder 428 parts by weight of binder 1, 137 parts by weight of glycidyl methacrylate, 6.5 parts by weight of p-methoxyphenol, 2.2 parts by weight of tetraethylammonium chloride and 900 parts by weight of propylene glycol monomethyl ether acetate, were charged into a reactor and reacted with stirring in air at 120° C. for 15 hours, to obtain a "binder 6" solution having an acid value of 170 and in which glycidyl methacrylate was reacted to 50% of the entire methacrylic acid component of binder 1.

Production (1) of aluminum support

An aluminum plate was degreased with 3% sodium hydroxide and then subjected to electrolytic etching treatment in a 11.5 g/l hydrochloric acid bath at 25° C. at a current density of 80 A/dm² for 11 seconds. Then, it was washed with water and then anodized in a 30% sulfuric acid bath at 30° C. at a current density of 11.5 A/dm² for 15 seconds. Then, it was washed with water and dried to obtain an aluminum plate for a lithographic printing plate (hereinafter referred to as "support 1").

Production (2) of aluminum support

Support 1 was further subjected to hydrophilic treatment with a 1% sodium orthosilicate aqueous solution at 85° C. for 30 seconds, followed by washing with water and drying to obtain an aluminum plate for a lithographic printing plate (hereinafter referred to simply as "support 2").

EXAMPLES 1 to 4 and COMPARATIVE EXAMPLES 1 to 4

The following photopolymerizable composition coating liquid 1 was coated on support 1 by means of a bar coater so that the dried film thickness would be 2 g/m² and dried. Further, an aqueous polyvinyl alcohol solution was coated thereon by means of a bar coater so that the dried film thickness would be 3 g/m², and dried to obtain a photosensitive lithographic printing plate. The photosensitive lithographic printing plate was evaluated with respect to the following evaluation items. The results are shown in Table 1.

Photopolymerizable composition coating liquid 1

| | |
|---|---|
| Ethylenic monomers identified in Table 1 | Total 55 parts by weight |
| Polymer binder identified in Table 1 | 45 parts by weight |
| Compound of the following formula (S-1) | 2.0 parts by weight |
| Titanocene compound of the following formula (T-1) | 10 parts by weight |
| 2-Mercaptobenzothiazole | 5.0 parts by weight |
| Ethyl N,N-dimethylbenzoate | 10 parts by weight |
| Copper phthalocyanine pigment | 3.0 parts by weight |
| Cyclohexanone | 1090 parts by weight |

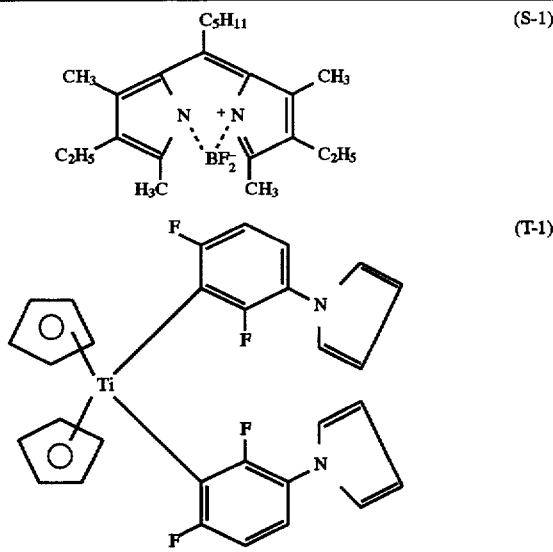

EVALUATION ITEMS

Sensitivity

The photosensitive lithographic printing plate was exposed by means of a diffraction spectral irradiation apparatus (RM-23, manufactured by Narumi K.K.), then immersed in an aqueous solution containing 0.8 wt % of anhydrous sodium carbonate and 3 wt % of Perex NBL (manufactured by Kao Corporation) and rubbed seven times with a sponge for development. From the height of the cured image thereby obtained, the light energy required for the photocuring by light rays with a wavelength of 532 nm, was determined.

Developability

The photosensitive lithographic printing plate was subjected to development in the same manner as for evaluation of the sensitivity without exposure. One drop of methylcellosolve was dropped on the obtained sample and dried, whereupon inking was made with an image-forming ink ("SPO-1", tradename, manufactured by Konica K.K.). Here, symbol o indicates that the ink did not attach at all, symbol Δ indicates that the ink slightly attached along the fringe of the dropped methylcellosolve, and symbol X indicates that the ink attached over the entire surface.

Printing resistance

The photosensitive lithographic printing plate was subjected to scanning exposure by an air-cooled argon laser ("PI-R", tradename, manufactured by Dainippon Screen K.K.) with an exposure of 100 μj/cm$^2$ followed by development in the same manner as in the evaluation of the sensitivity. The obtained printing plate was subjected to printing by "DAIYA-1F-2 Model" (manufactured by Mitsubishi Heavy Industry Company Limited), whereby the number of printed sheets until the image portion (120 lines, 4% of small dots) was broken, was taken as printing resistance.

EXAMPLES 5 to 7 and COMPARATIVE EXAMPLES 5 and 6

The following photopolymerizable composition coating liquid 2 was coated on support 2 by means of a bar coater so that the dried film thickness would be 2 g/m$^2$, and dried. Further, an aqueous polyvinyl alcohol solution was coated thereon by means of a bar coater so that the dried film thickness would be 3 g/m2, and dried to obtain a photosensitive lithographic printing plate. The obtained photosensitive lithographic printing plate was evaluated with respect to the above evaluation items. The results are shown in Table 2.

Photopolymerizable composition coating liquid 2

| | | |
|---|---|---|
| Ethylenic monomers identified in Table 2 | Total | 55 parts by weight |
| Polymer binder identified in Table 2 | | 45 parts by weight |
| Compound of the above formula (S-1) | | 2.0 parts by weight |
| Titanocene compound of the above formula (T-1) | | 10 parts by weight |
| 2-Mercaptobenzothiazole | | 5.0 parts by weight |
| Ethyl N,N-dimethylbenzoate | | 10 parts by weight |
| Copper phthalocyanine pigment | | 3.0 parts by weight |
| Cyclohexanone | | 1090 parts by weight |

EXAMPLES 8 to 11 and COMPARATIVE EXAMPLES 7 to 9

The same operation as in Examples 1 to 3 and Comparative Examples 1 to 4, was carried out except that the following coating liquid 3 was coated on support 2. The results are shown in Table 3.

Photopolymerizable composition coating liquid 3

| | |
|---|---|
| Ethylenic monomers identified in Table 3 | Total 55 parts by weight |
| Polymer binder identified in Table 3 | 45 parts by weight |
| Compound of the following formula (S-2) | 2.0 parts by weight |
| Compound of the following formula (T-2) | 10 parts by weight |
| 2-Mercaptobenzothiazole | 5.0 parts by weight |
| Ethyl N,N-dimethylbenzoate | 10 parts by weight |
| Copper phthalocyanine pigment | 3.0 parts by weight |
| Cyclohexanone | 1090 parts by weight |

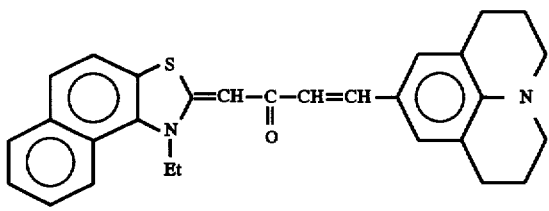

(S-2)

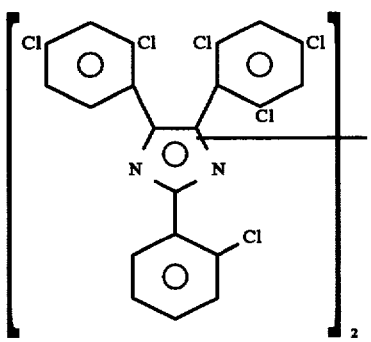

(T-2)

TABLE 1

| | | Example 1 | Example 2 | Example 3 | Example 4 | Comparative Example 1 | Comparative Example 2 | Comparative Example 3 | Comparative Example 4 |
|---|---|---|---|---|---|---|---|---|---|
| Ethyl- | Compound-1 | | 5 | 10 | | | 5 | | 5 |
| enic | Compound-2 | 5 | 5 | 10 | 5 | | 5 | | 5 |
| monomers | Compound-3 | 25 | 22.5 | 17.5 | 25 | 27.5 | 22.5 | 27.5 | 22.5 |
| | Compound-4 | 25 | 22.5 | 17.5 | | 27.5 | 22.5 | 27.5 | 22.5 |
| | Compound-7 | | | | 25 | | | | |
| Polymer | Binder-2 | 40 | 40 | 40 | 40 | | | 40 | |
| binders | Binder-4 | 5 | 5 | 5 | 5 | | | 5 | |
| | Binder-1 | | | | | 40 | 40 | | |
| | Binder-3 | | | | | 5 | 5 | | |
| | Binder-5 | | | | | | | | 40 |
| | Binder-6 | | | | | | | | 5 |
| Sensitivity (μJ/cm$^2$) | | 60 | 60 | 60 | 60 | 200 | 160 | 70 | 90 |
| Developability | | O | O | O | O | X | O | X | Δ |
| Printing resistance (× 10,000 sheets) | | 6.0 | 6.0 | 6.0 | 6.0 | 0.5 | 1.0 | 5.0 | 3.0 |

TABLE 2

|  |  | Example 5 | Example 6 | Example 7 | Comparative Example 5 | Comparative Example 6 |
|---|---|---|---|---|---|---|
| Ethylenic monomers | Compound-5 |  | 5 | 10 |  |  |
|  | Compound-6 | 5 | 5 | 10 |  |  |
|  | Compound-3 | 25 | 22.5 | 17.5 | 27.5 | 27.5 |
|  | Compound-4 | 25 | 22.5 | 17.5 | 27.5 | 27.5 |
| Polymer binders | Binder-2 | 40 | 40 | 40 | 40 |  |
|  | Binder-4 | 5 | 5 | 5 | 5 |  |
|  | Binder-1 |  |  |  |  | 40 |
|  | Binder-3 |  |  |  |  | 5 |
|  | Binder-5 |  |  |  |  |  |
|  | Binder-6 |  |  |  |  |  |
| Sensitivity ($\mu J/cm^2$) |  | 70 | 60 | 60 | 120 | 200 |
| Developability |  | ○ | ○ | ○ | ○ | X |
| Printing resistance ($\times$ 10,000 sheets) |  | 6.0 | 6.0 | 6.0 | 0.5 | 0.5 |

TABLE 3

|  |  | Example 8 | Example 9 | Example 10 | Example 11 | Comparative Example 7 | Comparative Example 8 | Comparative Example 9 |
|---|---|---|---|---|---|---|---|---|
| Ethylenic monomers | Compound-1 | 5 |  | 5 |  |  | 5 | 5 |
|  | Compound-2 | 5 |  | 5 |  |  | 5 | 5 |
|  | Compound-5 |  | 5 | 10 |  |  |  |  |
|  | Compound-6 |  | 5 |  | 10 |  |  |  |
|  | Compound-3 | 22.5 | 22.5 | 17.5 | 22.5 | 27.5 | 22.5 | 22.5 |
|  | Compound-4 | 22.5 | 22.5 | 17.5 | 22.5 | 27.5 | 22.5 | 22.5 |
| Polymer binders | Binder-2 | 20 | 20 | 20 | 20 | 20 |  |  |
|  | Binder-4 | 25 | 25 | 25 | 25 | 25 |  |  |
|  | Binder-1 |  |  |  |  |  | 20 |  |
|  | Binder-3 |  |  |  |  |  | 25 |  |
|  | Binder-5 |  |  |  |  |  |  | 20 |
|  | Binder-6 |  |  |  |  |  |  | 25 |
| Sensitivity ($\mu J/cm^2$) |  | 60 | 60 | 50 | 60 | 90 | 90 | 80 |
| Developability |  | ○ | ○ | ○ | ○ | △ | ○ | △ |
| Printing resistance $\times$ (10,000 sheets) |  | 6.0 | 6.0 | 6.0 | 6.0 | 0.5 | 2.0 | 3.0 |

In Tables 1 to 3, symbols (compound 1 to compound 7) in the column for ethylenic monomers represent the following compounds, respectively.

Compound 1

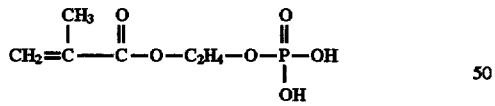

Compound 2

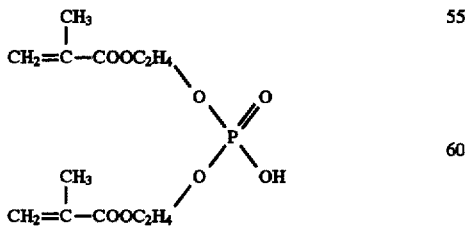

Compound 3

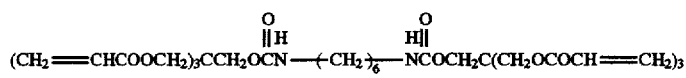

(UA-306H, manufactured by Shin Nakamura Kagaku Kogyo K.K.)

Compound 4

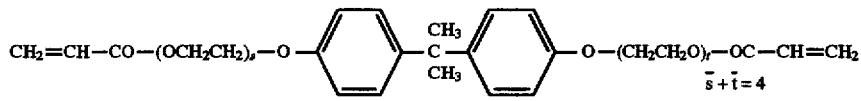

(A-BPE-4, manufactured by Shin Nakamura Kagaku Kogyo K.K.)

Compound 5

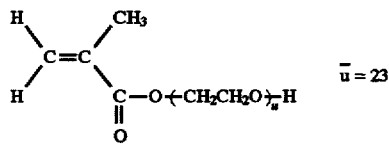

Compound 6

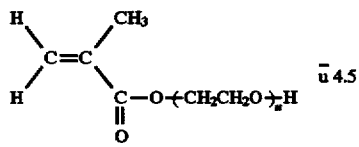

Compound 7

Dipentaerythritol hexaacrylate (KAYAMA DPHA, manufactured by Nippon Kayaku Co., Ltd.)

According to the present invention, it is possible to provide a photopolymerizable composition for a photosensitive lithographic printing plate excellent equally in the developability, the sensitivity and the adhesion to an aluminum support, and a photosensitive lithographic printing plate employing such a composition.

What is claimed is:

1. A photopolymerizable composition for a photosensitive lithographic printing plate, comprising (A) addition-polymerizable ethylenically unsaturated bond-containing monomers, (B) a photopolymerization initiator system and (C) a polymer binder having carboxyl groups in its molecule, wherein the addition-polymerizable ethylenically unsaturated bond-containing monomers (A) contain a specific monomer which is a phosphoric acid ester compound (A-1) having at least one (meth)acryloyl group and/or a compound (A-2) of the following formula (I):

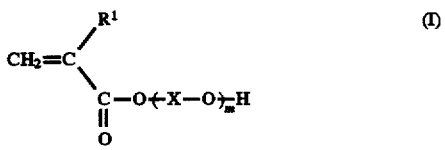

wherein $R^1$ is a hydrogen atom or a methyl group, X is a linear or branched $C_{1-6}$ alkylene group which is optionally substituted by halogen, and m is an integer of at least 2, and the polymer binder (C) having carboxyl groups in its molecule, is a compound having at least a part of the carboxyl groups reacted with an alicyclic epoxy group-containing unsaturated compound.

2. The photopolymerizable composition for a photosensitive lithographic printing plate according to claim 1, wherein the specific monomer is a phosphoric acid ester compound (A-1) having at least one (meth)acryloyl group and a compound (A-2) of the formula (I) and constitutes from 1 to 60 wt % in all addition-polymerizable ethylenically unsaturated bond-containing monomers (A).

3. The photopolymerizable composition for a photosensitive lithographic printing plate according to claim 1, wherein the specific monomer is a phosphoric acid ester compound (A-1) having at least one (meth)acryloyl group and constitutes from 1 to 60 wt % in all addition-polymerizable ethylenically unsaturated bond-containing monomers (A).

4. The photopolymerizable composition for a photosensitive lithographic printing plate according to claim 1, wherein the specific monomer is a compound (A-2) of the formula (I) and constitutes from 1 to 60 wt % in all addition-polymerizable ethylenically unsaturated bond-containing monomers (A).

5. The photopolymerizable composition for a photosensitive lithographic printing plate according to claim 1, wherein the phosphoric acid ester compound (A-1) having at least one (meth)acryloyl group is a compound of the following formula (II):

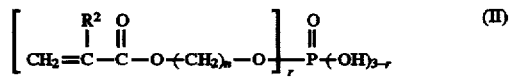

wherein $R^2$ is a hydrogen atom or a methyl group, n is an integer of from 1 to 25, and r is 1 or 2.

6. The photopolymerizable composition for a photosensitive lithographic printing plate according to claim 1, wherein the polymer binder (C) having carboxyl groups in its molecule, is a compound having from 5 to 90 mol % of the carboxyl groups reacted with an alicyclic epoxy group-containing unsaturated compound.

7. The photopolymerizable composition for a photosensitive lithographic printing plate according to claim 1, which further contains a compound of the following formula (III):

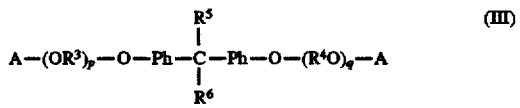

wherein A is an acryloyl group or a methacryloyl group, each of $R^3$ and $R^4$ is an alkylene group which may be branched, and each of $R^5$ and $R^6$ is a hydrogen atom, an alkyl group which may have a substituent, a cycloalkyl group which may have a substituent or a phenyl group which may have a substituent, Ph is a phenylene group, and p and q are positive integers satisfying p+q=2 to 30.

8. The photopolymerizable composition for a photosensitive lithographic printing plate according to claim 1, which further contains a urethane (meth)acrylic acid ester compound.

9. The photopolymerizable composition for a photosensitive lithographic printing plate according to claim 1, wherein the alicyclic epoxy group-containing unsaturated compound has a structure in which a cycloalkane skeleton and an oxirane skeleton are fused.

10. The photopolymerizable composition for a photosensitive lithographic printing plate according to claim 9, wherein the alicyclic epoxy group-containing unsaturated compound is at least one compound of the following formulas (IV), (V) and (VI):

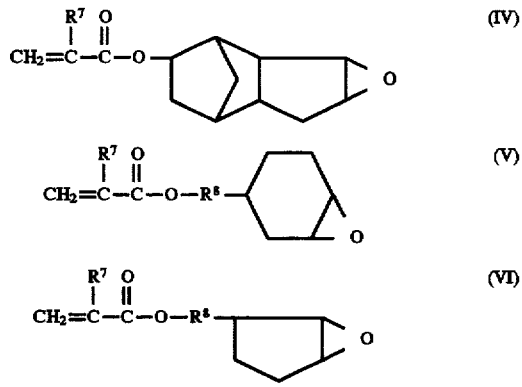

wherein $R^7$ is a hydrogen atom or a methyl group, and $R^8$ is a bivalent $C_{1-6}$ aliphatic hydrocarbon group.

11. The photopolymerizable composition for a photosensitive lithographic printing plate according to claim 1, wherein the photopolymerization initiator system contains a sensitizer having absorption in a visible light range.

12. The photopolymerizable composition for a photosensitive lithographic printing plate according to claim 1, wherein the photopolymerization initiator system contains a titanocene.

13. The photopolymerizable composition for a photosensitive lithographic printing plate according to claim 1, wherein the photopolymerization initiator system contains a hexaarylbiimidazole.

14. A photosensitive lithographic printing plate comprising an aluminum support and a photosensitive resin layer formed thereon, wherein the photosensitive resin layer is composed of a photopolymerizable composition as defined in claim 1.

15. The photosensitive lithographic printing plate according to claim 14, which comprises an aluminum support having grain treatment and anodizing treatment applied thereto and the photosensitive resin layer formed thereon, wherein the anodizing treatment has been carried out in an electrolyte containing sulfuric acid.

16. The photosensitive lithographic printing plate according to claim 14, which comprises an aluminum support having grain treatment and anodizing treatment applied thereto and having hydrophilic treatment further applied thereto, and the photosensitive resin layer formed thereon, wherein the anodizing treatment has been carried out in an electrolyte containing sulfuric acid.

* * * * *